(12) United States Patent
Fukushima et al.

(10) Patent No.: US 8,250,736 B2
(45) Date of Patent: Aug. 28, 2012

(54) METHOD FOR MANUFACTURING A MAGNETIC RECORDING MEDIUM

(75) Inventors: Masato Fukushima, Chiba (JP); Shinichi Ishibashi, Tokyo (JP); Akira Yamane, Ichihara (JP)

(73) Assignee: Showa Denko K.K., Tokyo (JP)

( * ) Notice: Subject to any disclaimer, the term of this patent is extended or adjusted under 35 U.S.C. 154(b) by 251 days.

(21) Appl. No.: 12/606,723

(22) Filed: Oct. 27, 2009

(65) Prior Publication Data
US 2010/0128378 A1    May 27, 2010

(30) Foreign Application Priority Data
Oct. 29, 2008   (JP) ................ P2008-278444

(51) Int. Cl.
*G11B 5/127* (2006.01)
*H04R 31/00* (2006.01)

(52) U.S. Cl. ............... 29/603.06; 29/603.03; 29/603.07; 216/22; 216/52; 216/67; 216/88; 204/192.1; 360/55

(58) Field of Classification Search ............... 29/603.03, 29/603.04, 603.06, 603.07; 216/22, 38–40, 216/52, 67, 88; 204/192.1; 360/55; 428/833
See application file for complete search history.

(56) References Cited

U.S. PATENT DOCUMENTS

| | | | |
|---|---|---|---|
| 7,067,207 B2 | 6/2006 | Kamata et al. | |
| 7,147,790 B2 | 12/2006 | Wachenschwanz et al. | |
| 7,549,209 B2 | 6/2009 | Wachenschwanz et al. | |
| 2006/0183004 A1 | 8/2006 | Hattori et al. | |
| 2007/0153419 A1* | 7/2007 | Arai et al. ..................... 360/131 |
| 2010/0128378 A1* | 5/2010 | Fukushima et al. ............ 360/55 |
| 2011/0211272 A1* | 9/2011 | Butler et al. ..................... 360/55 |

FOREIGN PATENT DOCUMENTS

| | | | |
|---|---|---|---|
| JP | 63-304423 A | 12/1988 |
| JP | 2002-133634 A | 5/2002 |
| JP | 2004-164692 A | 6/2004 |
| JP | 2004-178793 A | 6/2004 |
| JP | 2004-178794 A | 6/2004 |
| JP | 2006-031852 A | 2/2006 |
| JP | 2006-120222 A | 5/2006 |
| JP | 2006-228282 A | 8/2006 |

OTHER PUBLICATIONS

Japanese Office Action issued in Japanese Application No. 2008-278444 mailed Jul. 17, 2012.

* cited by examiner

*Primary Examiner* — Paul D Kim
(74) *Attorney, Agent, or Firm* — Sughrue Mion, PLLC (57) ABSTRACT

A magnetic recording medium which does not easily cause a material containing Fe or Co to corrode is disclosed. The method for manufacturing a magnetic recording medium 122 includes a process of forming a magnetic layer 30 on a non-magnetic substrate 10, a process of forming a recessed area 65 in the magnetic layer 30, a process of forming a corrosion-resistant film 60 to cover an exposure surface 65c of the recessed area 65, and a process of forming a magnetic recording pattern made of the magnetically separated magnetic layer 30 by forming a non-magnetic layer 40 to fill in the recessed area 65.

7 Claims, 6 Drawing Sheets

METHOD FOR MANUFACTURING A MAGNETIC RECORDING MEDIUM

CROSS REFERENCE TO RELATED APPLICATION

The present application claims priority from Japanese Patent Application No. 2008-278444, filed on Oct. 29, 2008, the contents of which are hereby incorporated by reference into this application.

BACKGROUND OF THE INVENTION

1. Field of the Invention

The present invention relates to a method for manufacturing a magnetic recording medium used in a hard disk device or the like, the magnetic recording medium, and a magnetic recording-reproducing apparatus.

2. Background Art

Recently, the application range of magnetic recording apparatuses, such as magnetic disk devices, flexible disk devices, magnetic tape devices or the like, has widened to a great extent, and thus their importance is increasing. In addition, attempts to greatly enhance the recording density of the magnetic recording medium used in these devices are ongoing.

In particular, since the introduction of an MR head and PRML technique, the increased surface recording density growth has become more and more intense. Recently, since the introduction of a GMR head and a TMR head, surface recording density has continuously increased at the pace of approximately 50% a year.

The magnetic recording medium is required to achieve the higher recording density in the future. For this reason, it is necessary to heighten the coercivity, the signal/noise ratio (SNR) and resolution of a magnetic recording layer. Further, recently, efforts to increase the line recording density and the track density so as to increase the surface recording density continue.

In the latest magnetic recording apparatuses, the track density reaches 110 kTPI. However, a problem is liable to occur in that as the track density is increased, pieces of magnetic recording information interfere with each other between adjacent tracks and a magnetization transition region of a boundary area becomes a noise source, thereby deteriorating the SNR. This causes a bit error rate to deteriorate, which is an obstacle to increasing the recording density.

In order to increase the surface recording density, it is necessary to make the size of the respective recording bits on the magnetic recording medium fine, and to provide the respective recording bits with saturation magnetization and a magnetic film thickness as much as possible. However, there is a problem in that if the recording bit is miniaturized, magnetization minimizing volume per bit is decreased, so that recording data disappears due to magnetization reversal caused by heat fluctuation.

Further, since the distance between the tracks is contiguous, the magnetic recording apparatus requires a track servo technique of very high precision, and a method for executing the recording widely and the reproducing more narrowly than the recording is generally used so as to eliminate the effect of adjacent tracks as much as possible.

The method can suppress the effect of the adjacent tracks to a minimum, but there is a problem in that since it is difficult to obtain sufficient reproducing output, ensuring sufficient SNR is difficult.

As one method for solving the heat fluctuation and ensuring the SNR or ensuring sufficient output, there has been an attempt to increase the track density by forming recessed and raised areas on the surface of the recording medium along the track to physically separate the recording tracks.

The technique is hereinafter referred to as a discrete track method, and a magnetic recording medium manufactured by the same is referred to as a discrete track medium.

As one example of the discrete track medium, there has been known a magnetic recording medium formed on a non-magnetic substrate with a recessed and raised pattern formed on a surface thereof and having magnetic recording tracks and a servo signal pattern which are physically separated from each other (see Patent Document 1).

The magnetic recording medium has a ferromagnetic layer formed on the surface of the substrate with a plurality of recessed and raised areas formed on its surface, in which a soft magnetic layer is interposed between the surface of the substrate and the ferromagnetic layer, and a protective layer is formed on the surface of the ferromagnetic layer. The magnetic recording medium has a magnetic recording region formed in a raised area which is physically separated from its circumference.

With the magnetic recording medium, since the occurrence of a magnetic wall on the soft magnetic layer is suppressed, the effect of the heat fluctuation has hardly any effect. Further, since there is no interference between the adjacent signals, a high-density magnetic recording medium with little noise can be manufactured.

The discrete track method includes a method for forming a track after forming a magnetic recording medium made of several layers of thin films, and a method for forming a thin film of a magnetic recording medium after a recessed and raised pattern is previously directly formed on a surface of a substrate or is formed on a thin film layer for formation of the track (e.g., see Patent Document 2 and Patent Document 3). In these methods, the former is often referred to as a magnetic layer machining type, and the latter is referred to as an emboss machining type.

[Patent Document 1] Japanese Unexamined Patent Application Publication No. 2004-164692

[Patent Document 2] Japanese Unexamined Patent Application Publication No. 2004-178793

[Patent Document 3] Japanese Unexamined Patent Application Publication No. 2004-178794

However, in the case in which the magnetic recording medium is used in the hard disk drive, there is a problem of corrosion resistance in the magnetic recording medium. That is, there is a problem in that since the magnetic recording medium used in the hard disk drive is made of a material containing Fe or Co, and the magnetic recording medium is easily corroded by water or the like introduced from the surroundings, thereby deteriorating the magnetization reversion characteristic of the magnetic recording medium or damaging the magnetic recording-reproducing head due to the corrosive substance attached to the magnetic recording-reproducing head.

The present invention takes the above circumstances into consideration, and an object thereof is to provide a magnetic recording medium capable of preventing a material containing Fe or Co from being easily corroded.

SUMMARY OF THE INVENTION

The inventor has focused on researching the cause of the corrosion of a magnetic layer in a magnetic recording medium of a magnetic layer machining type in which a magnetic recording pattern is formed by physically machining the magnetic layer, and found that the corrosion occurs in the machined portion of the magnetic layer. In addition, as a result of examining the cause, it was found that the machined portion of the magnetic layer is activated by ion milling or the like, and the activated surface reacts with fillers such as non-magnetic material leading to corrosion.

As a result of making efforts to avoid this corrosion, it was found that a corrosion-resistant film such as chrome, formed on a portion from which the magnetic layer is removed, could reduce corrosion of the magnetic layer, and thus the present invention was completed.

That is, the invention employs the following configuration.

(1) A method for manufacturing a magnetic recording medium comprising the steps of: forming a magnetic layer on a non-magnetic substrate; forming a plurality of recessed areas in the magnetic layer; forming a corrosion-resistant film to cover an exposure surface of the recessed area; and forming a non-magnetic layer to fill in the recessed area covered by the corrosion-resistant film to form a magnetic recording pattern made of a magnetically separated magnetic layer.

(2) The method for manufacturing the magnetic recording medium according to the above (1), wherein the corrosion-resistant film is a metal film which is at least one selected from Cr, Ni, Al, Ti, Ta, Cu, Mo, Ru, Rh, Pd, W, Pt, and Au.

(3) The method for manufacturing the magnetic recording medium according to the above (1) or (2), wherein the corrosion-resistant film is the Cr film.

(4) The method for manufacturing the magnetic recording medium according to any one of the above (1) to (3), wherein the corrosion-resistant film is formed by a sputtering method using He gas or Ne gas.

(5) The method for manufacturing the magnetic recording medium according to any one of the above (1) to (4), wherein the non-magnetic layer is made of an organosilicon compound.

(6) The method for manufacturing the magnetic recording medium according to any one of the above (1) to (5), wherein the step of forming the recessed area in the magnetic layer includes a process of forming and stacking a mask layer and a resist layer on the magnetic layer in this order, a process of forming a recessed portion in the resist layer by a nanoimprint method, and a process of forming a recessed area in the magnetic layer by deepening the recessed portion to the magnetic layer through an etching method or an ion milling method.

(7) The method for manufacturing the magnetic recording medium according to the above (6), wherein the step of forming the corrosion-resistant film to cover the exposure surface of the recessed area is a step of forming the corrosion-resistant film to cover the recessed portion and the resist layer, and then removing the resist layer and the mask layer by using an inductively coupled plasma or a reactive ion plasma method, in which the corrosion-resistant film formed to cover the exposure surface of the recessed area is left.

(8) A magnetic recording medium including a magnetic recording pattern made of a magnetically separated magnetic layer on a non-magnetic substrate, the magnetic recording medium including: a recessed area formed on the magnetic layer; a corrosion-resistant film formed to cover a surface of the recessed area; and a non-magnetic layer formed to fill in the recessed area covered by the corrosion-resistant film.

(9) A magnetic recording-reproducing apparatus including: the magnetic recording medium according to the above (8); a medium driving device that drives the magnetic recording medium in a driving direction; a magnetic head that performs the recording-reproducing of information on or from the magnetic recording medium; a magnetic head driving device that moves the magnetic head over the magnetic recording medium; and a recording-reproducing signal processing device that processes a recording-reproducing signal from the magnetic head.

According to the configuration, a magnetic recording medium can be provided which does not easily cause a material containing Fe or Co to corrode.

The method for manufacturing the magnetic recording medium according to the invention includes the steps of forming the magnetic layer on the non-magnetic substrate, forming the plurality of recessed areas in the magnetic layer, forming the corrosion-resistant film to cover the exposure surface of the recessed area, and forming the non-magnetic layer to fill in the recessed area covered by the corrosion-resistant film to form the magnetic recording pattern made of the magnetically separated magnetic layer. Therefore, it is possible that the corrosion-resistant film prevents the magnetic layer of the exposure surface of the recessed area from reacting with the non-magnetic layer and thus being corroded, so that the corrosion resistance can be remarkably enhanced, thereby providing a magnetic recording medium having high environment resistance.

In the magnetic recording medium including the magnetic recording pattern made of the magnetically separated magnetic layer on the non-magnetic substrate, according to the invention, the magnetic recording medium includes the recessed area formed on the magnetic layer, the corrosion-resistant film formed to cover the exposure surface of the recessed area, and the non-magnetic layer formed to fill in the recessed area covered by the corrosion-resistant film. Therefore, it is possible to prevent the magnetic layer on the exposure surface of the recessed area from being corroded due to the reaction with the non-magnetic layer, thereby providing a magnetic recording medium having high corrosion resistance.

The magnetic recording-reproducing apparatus according to the invention includes the magnetic recording medium of the invention, the medium driving device that drives the magnetic recording medium in the driving direction, the magnetic head that performs recording-reproducing of information on or from the magnetic recording medium, the magnetic head driving device that moves the magnetic head over the magnetic recording medium, and the recording-reproducing signal processing device that processes the recording-reproducing signal from the magnetic head. Therefore, a magnetic recording-reproducing apparatus including the magnetic recording medium having high environmental resistance can be provided.

DETAILED DESCRIPTION OF THE INVENTION

Now, an embodiment for carrying out the invention will be described. In this instance, while, for example, a discrete type magnetic recording medium is described in detail, the invention is not limited to the embodiments below, and, for example, components of the embodiments may be combined as appropriate.

Embodiment 1

Figure 1:
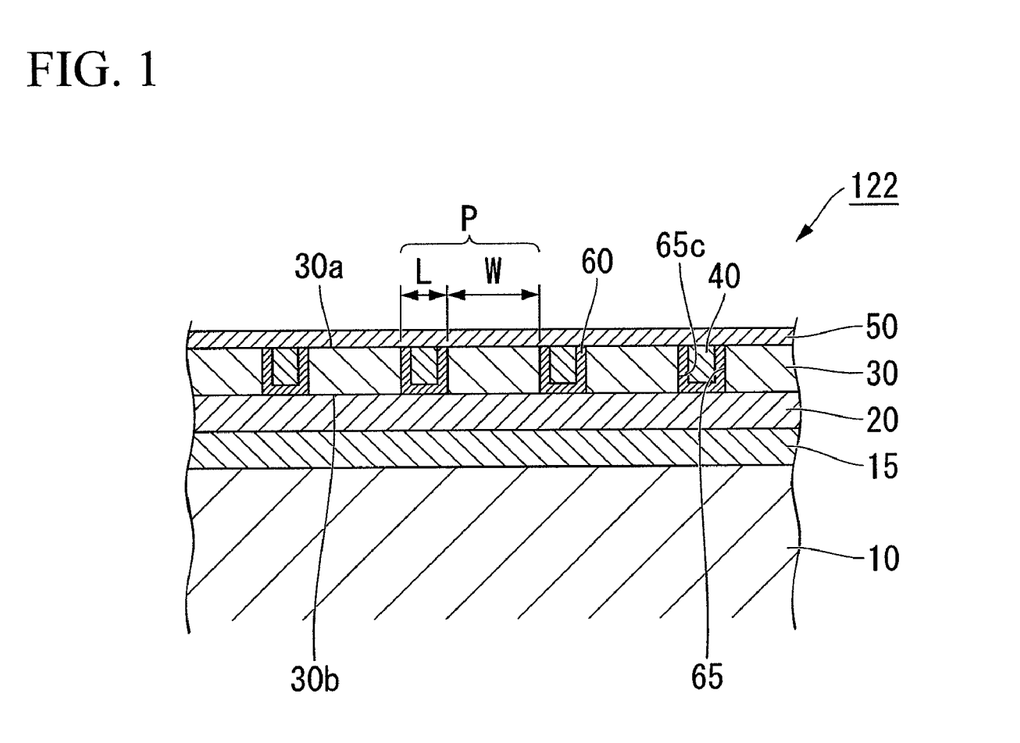
FIG. 1 is a cross-sectional view showing an example of a magnetic recording medium according to the invention.

FIG. 1 is a cross-sectional diagram showing an example of the discrete type magnetic recording medium according to the embodiment of the invention.

As shown in FIG. 1, the magnetic recording medium 122 according to the embodiment of the invention substantially includes a soft magnetic layer 15, an intermediate layer 20, a magnetic layer 30, and a protective layer 50 which are formed on a non-magnetic substrate 10 in this order. Further, the magnetic layer 30 is provided with a recessed area 65, and a magnetic recording pattern is constituted by a corrosion-resistant film 60 formed to cover an exposure surface 65c of the recessed area 65, a non-magnetic layer 40 formed to fill in the recessed area 65, and a magnetic layer 30 magnetically separated by the non-magnetic layer 40. A surface of the respective layers on the non-magnetic substrate side is hereinafter referred to as a lower surface, while an opposite surface is referred to as an upper surface.

<Non-magnetic Substrate>

Any non-magnetic substrate can be used as the non-magnetic substrate 10, such as an Al alloy substrate containing Al as a main component, for example, Al—Mg alloy, or a substrate made of common soda glass, aluminosilicate glass, crystallized glass, silicon, titanium, ceramic, or resins of various kinds. Among them, it is preferable that as the Al alloy substrate, a glass substrate made of crystallized glass or the silicon substrate be used.

In addition, the non-magnetic substrate 10 has average surface roughness (Ra) of 1 nm or less, preferably 0.5 nm or less, and more preferably 0.1 nm or less.

<Soft Magnetic Layer>

The soft magnetic layer 15 is made of a soft magnetic material. The soft magnetic material used for the soft magnetic layer 15 includes, for example, an FeCo-base alloy (FeCoB, FeCoSiB, FeCoZr, FeCoZrB, FeCoZrBCu or the like), an FeTa-based alloy (FeTaN, FeTaC or the like), a Co-based alloy (e.g., CoTaZr, CoZrNB, CoB or the like), and so forth.

<Intermediate Layer>

The material of the intermediate layer 20 includes Ru and so forth. In addition, in the case in which the magnetic layer 30 is a vertical magnetic layer, an orientation control film, such as Pt, Pd, NiCr, NiFeCr or the like, may be interposed between the soft magnetic layer 15 and the magnetic layer 30, instead of the intermediate layer 20. Moreover, an underlying layer consisting of the orientation control film and the intermediate layer 20 may be interposed between the soft magnetic layer 15 and the magnetic layer 30.

<Magnetic Layer>

The magnetic layer 30 is formed on the intermediate layer 20. A material of the magnetic layer 30 includes a CoCrPt-based alloy, an FePt-based alloy, a CoPt-based alloy, an FePd-based alloy, a CoPd-based alloy, and so forth. It is preferable that the magnetic layer 30 be made of a material containing an alloy mainly containing Co as a main component, and, as examples, there are 67Co-18Cr-15Pt alloy, 60Co-15Cr-15Pt alloy or 70Co-5Cr-15Pt-10SiO$_2$ alloy, 25Fe-30Co-45Pt alloy, and 38Fe-10Co-5Ni-47Pt alloy.

In addition, the magnetic layer 30 may be added with an oxide as a gain-boundary constitution material forming a granular structure. The oxide forming the granular structure includes preferably at least one of Si oxide, Ti oxide, W oxide, Cr oxide, Co oxide, Ta oxide and Ru oxide.

The magnetic layer 30 is made of single layer or two or more layers.

The magnetic layer 30 preferably has a thickness equal to or more than 3 nm and equal to or less than 20 nm, and more preferably equal to or more than 5 nm and equal to or less than 15 nm. Consequently, when reproducing, an output above a certain level can be obtained, thereby suppressing the deterioration of several parameters indicating the recording-reproducing characteristic. In this instance, in order to obtain the output above a certain level when reproducing, the magnetic layer 30 is required to have a thickness above a certain level, and several parameters indicating the recording-reproducing characteristic are generally deteriorated as the output is increased.

The magnetic layer 30 may be formed to obtain a sufficient output/input according to the kind of a magnetic alloy to be used and a stacking structure.

A method for forming the magnetic layer 30 includes a sputtering method.

The magnetic layer 30 may be a vertical magnetic recording layer if it is an in-plane magnetic recording layer, but the vertical magnetic recording layer shown in the embodiment is preferable in order to achieve a higher recording density.

In this instance, as the magnetic recording layer for the in-plane magnetic recording medium, for example, a stacked structure made of a CrMo underlying layer of a non-magnetic property and a CoCrPtTa magnetic layer of a ferromagnetic property may be used.

The magnetic layer 30 is provided with the recessed area 65 in order to space the magnetic layer 30. The corrosion-resistant film 60 is formed to cover the exposure surface 65c of the recessed area 65. Further, the non-magnetic layer 40 is formed to fill in the recessed area 65 covered by the corrosion-resistant film 60.

In this instance, the exposure surface 65c includes an inner wall and a bottom surface which are exposed when the recessed area 65 is formed in the magnetic layer 30.

<Non-magnetic Layer>

A material of the non-magnetic layer 40 is preferably an organosilicon compound. Since the organosilicon compound has low viscosity, low contraction when curing, and good etching characteristic such as ion milling, it can obtain a smooth etched surface. The organosilicon compound includes, for example, a silisesquioxane skeleton-containing compound.

A method for forming the non-magnetic layer 40 is preferably a spin on glass (SOG) method. The spin on glass method is a method for forming a thin film by applying an application solution of a glass component containing an organosilicon compound and the like and heating and sintering the application solution.

The organosilicon compound is used as a material of the non-magnetic layer 40, and a film formed by the spin on glass method has excellent coverage. It fills in the recessed area 65 to form a film having a flat surface.

In this instance, if the magnetic layer 30 is readable and writable by a magnetic head of a magnetic recording-reproducing apparatus which will be described below, the nonmagnetic layer 40 does not necessarily have a fully nonmagnetic property, and a little magnetic property may remain therein.

<Corrosion-resistant Film>

It is preferable that a metal film having high corrosion-resistant property as compared with Fe or Co be used as the corrosion-resistant film 60. The metal film is at least one selected from Cr, Ni, Al, Ti, Ta, Cu, Mo, Ru, Rh, Pd, W, Pt, and Au as examples of the metal film. Among them, it is preferable that a metal film of one kind, such as a Cr film, Ru film, Ti film, Ta film, Mo film, Pd film, or Pt film, and a metal film of two kinds, such as CrTi film or CrPt film be used. In addition, the use of Cr among them is more preferable in terms of the corrosion-resistant property and the adhesion to the magnetic layer 30.

In terms of the corrosion-resistant property, it is preferable that the corrosion-resistant film 60 have a film thickness of 2 nm or more. Further, in terms of the adhesion to the magnetic layer 30 and the convenience of film formation, a sputtering method is preferably used as the method for forming the corrosion-resistant film 60.

By installing the corrosion-resistant film 60 between the magnetic layer 30 and the non-magnetic layer 40, it is possible to prevent a machined portion of the magnetic layer 30 which is activated by the ion milling or the like, that is, the magnetic layer 30 of the exposure surface 65c of the recessed area 65 from reacting with the non-magnetic layer 40 and thus being corroded.

<Magnetic Recording Pattern>

The magnetic recording pattern made of the magnetic layer 30 which is magnetically separated by the non-magnetic layer 40 is formed.

The magnetic recording pattern is sufficient if a pattern is made of the magnetic layer 30 which is magnetically separated by the non-magnetized non-magnetic layer 40, when seen from the upper surface 30a side at a plane. Consequently, it can achieve the object of the invention. That is, as shown in FIG. 1, the magnetic layer 30 may not be magnetically separated by the non-magnetized non-magnetic layer 40, when seen from the lower surface 30b side at a plane.

A width W of the magnetic layer 30 corresponding to a recording track width is preferably 200 nm or less, and a width L of the non-magnetic layer 40 is preferably 100 nm or less. That is, it is preferable that a track pitch P(=W+L) be 300 nm or less. The recording density can be increased by narrowing the width W of the magnetic layer 30, the width L of the non-magnetic layer 40 and the track pitch P, as described above.

The magnetic recording pattern may be so-called patterned media which are disposed at a constant regularity per bit, and the magnetic recording pattern may be media which are disposed in a track shape, or a servo signal pattern, It is preferable in terms of the convenient manufacture thereof, if the invention is applied to a so-called discrete type magnetic recording medium, in which the magnetic recording pattern is the magnetic recording track or the servo signal pattern.

<Protective Layer>

The protective layer 50 is formed on the magnetic layer 30. The protective layer 50 may use a material of a carbonaceous layer, such as carbon (C) of diamond like carbon (DLC), hydrogenated carbon ($H_xC$), carbon nitrogen (CN), amorphous carbon, silicon carbide (SiC), or the like, and a commonly used protective layer, such as $SiO_2$, $Zr_2O_3$, TiN, or the like. In addition, the protective layer 50 may be made of two or more layers.

<Lubricative Layer>

In this instance, although not shown in FIG. 1, a lubricative layer is preferably formed on the protective layer 50. A lubricant used in the lubricative layer includes a fluorine-based lubricant, a hydrogen carbide-based lubricant and a compound thereof. The lubricative layer has a thickness of approximately 1 to 4 nm.

Now, one example of a method for manufacturing the magnetic recording medium according to an embodiment of the invention will be described.

FIGS. 2 to 5 are process cross-sectional views explaining one example of the method for manufacturing the magnetic recording medium according to the embodiment of the invention.

As shown in FIGS. 2 to 5, the method for manufacturing a magnetic recording medium 122 according to the embodiment of the invention includes a process of forming the magnetic layer 30 on the non-magnetic substrate 10, a process of forming the recessed area 65 in the magnetic layer 30, a process of forming the corrosion-resistant film 60 to cover the exposure surface 65c of the recessed area 65, and a process of forming the magnetic recording pattern made of the magnetically separated magnetic layer 30 by forming the non-magnetic layer 40 to fill in the recessed area 65. The respective processes will now be described below.

<Process of Forming the Magnetic Layer>

Figure 2:
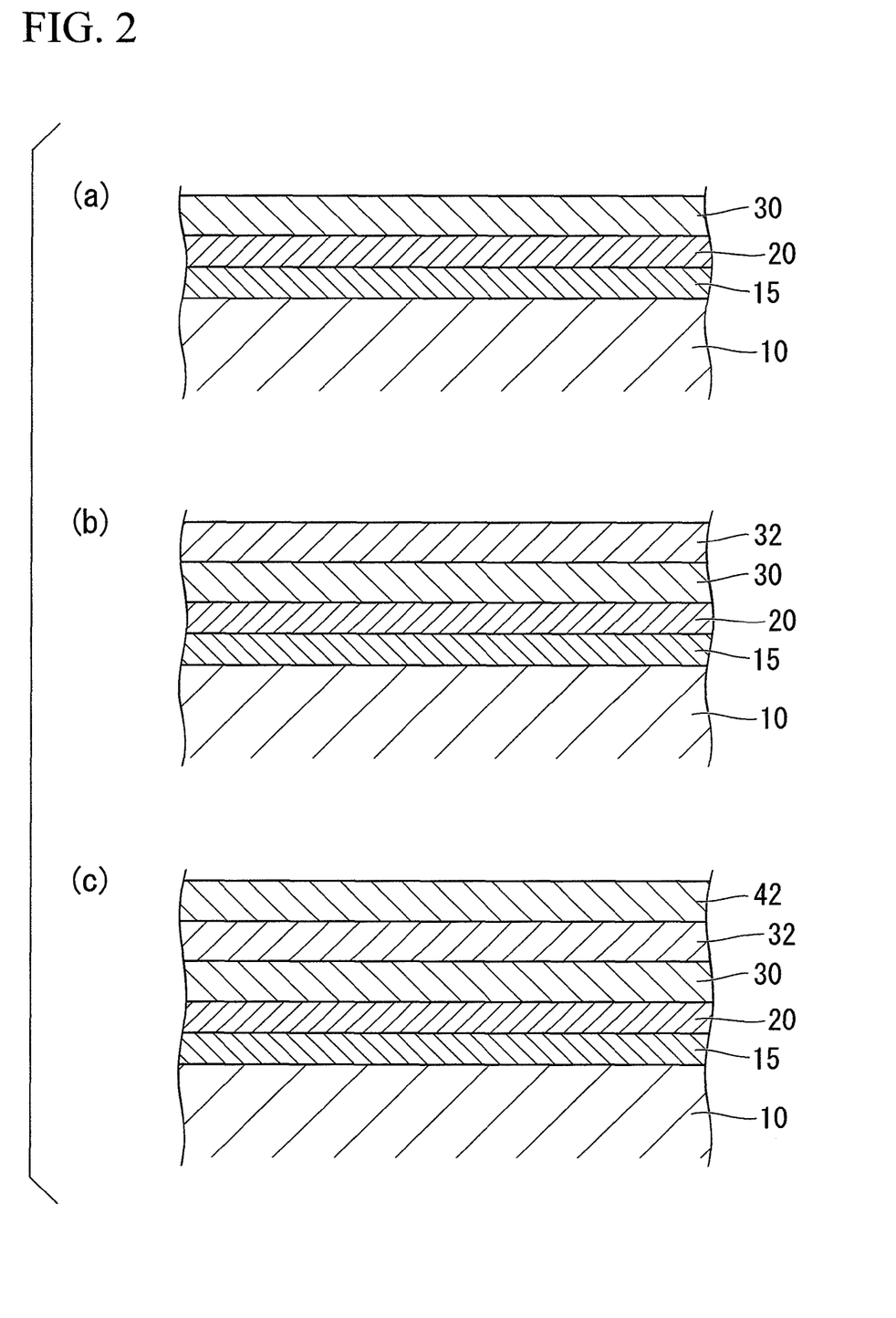
FIG. 2 is a process cross-sectional view showing an example of a method for manufacturing a magnetic recording medium according to the invention.

As shown in FIG. 2(a), the soft magnetic layer 15, the intermediate layer 20 and the magnetic layer 30 are stacked on the non-magnetic substrate 10 in this order.

For example, the soft magnetic layer 15 made of FeCoB alloy, the intermediate layer 20 made of Ru and the magnetic layer 30 made of 70Co-5Cr-15Pt-10$SiO_2$ alloy are stacked in this order by using a DC sputtering method.

<Process of Forming the Recessed Area>

Next, the mask layer 32 is formed on the magnetic layer 30, as shown in FIG. 2(b).

A material of the mask layer 32 contains preferably at least one selected from a group consisting of Ta, W, Ta nitride, W nitride, Si, $SiO_2$, $Ta_2O_5$, Re, Mo, Ti, V, Nb, Sn, Ga, Ge, As, Ni, and so forth.

Since the material has a high shield property to the milling ion or the like, the mask layer 32 having the high shield property to the milling ion or the like can be formed by forming the mask layer 32 using the material. Consequently, a magnetic recording pattern of high precision can be formed on the magnetic layer 30, thereby enhancing the magnetic recording pattern forming characteristic.

In addition, since the material can be easily removed by dry etching using reactive gas, the mask layer 32 is removed without leaving residues on the magnetic layer 30, thereby reducing contamination due to the residues on the magnetic layer 30.

Next, as shown in FIG. 2(c), the resist layer 42 is formed on the mask layer 32.

The resist layer 42 is preferably made of a material capable of being hardened by radiation irradiation. In this instance, the radiation is a broader concept of an electromagnetic wave, such as heat waves, visible rays, ultraviolet rays, X-rays, or gamma rays. Further, the material capable of being hardened by the radiation irradiation is, for example, a thermoset resin with respect to the heat waves, or an ultraviolet ray curable resin with respect to the ultraviolet rays.

In the case of using the material as a material of the resist layer 42, after the pattern is transferred by pressing a stamp 52 on the resist layer 42 through a nanoimprint method which will be described below, the resist layer 42 is irradiated by the radiation, so that the shape of the stamp 52 is transferred on the resist layer 42 with high precision.

As such, the mask layer 32 can be etched in the process of etching the mask layer 32 which will be described below, without formation of taper on sidewall of pattern in the mask layer 32. Further, it is possible to enhance the shield property of the mask layer 32 with respect to ions implanted by the ion milling. Consequently, since the magnetic recording pattern of high precision is formed on the magnetic layer 30, the magnetic recording pattern forming characteristic is thereby enhanced.

Figure 3:
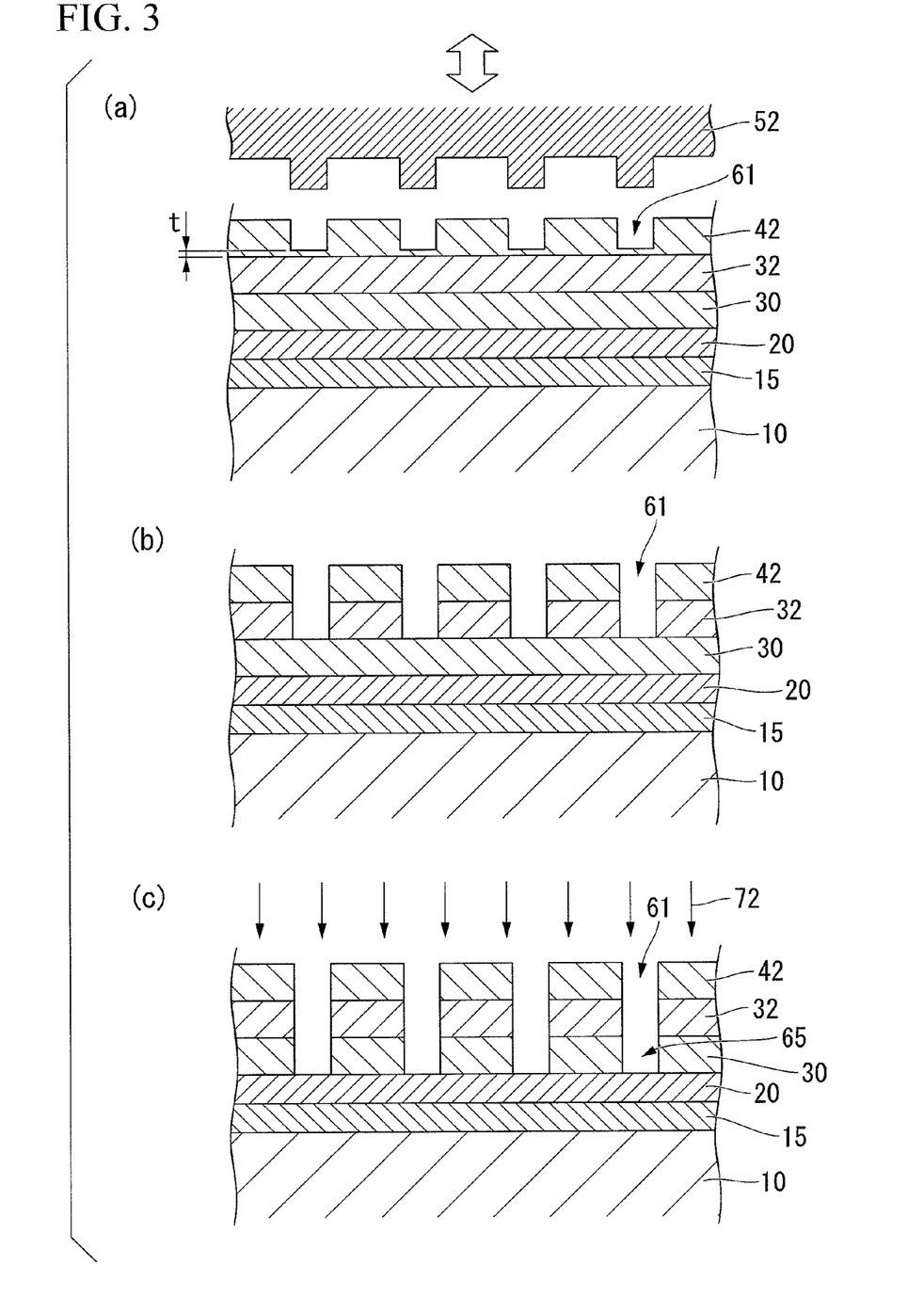
FIG. 3 is a process cross-sectional view showing an example of a method for manufacturing a magnetic recording medium according to the invention.

Next, as shown in FIG. 3(*a*), through the nanoimprint method, the stamp 52 is moved in a direction indicated by an arrow, and the surface of the stamp 52, having recessed and raised areas, is pressed on the resist layer 42 and then is left. Consequently, the resist layer 42 is provided with a plurality of recessed portions 61, and a negative pattern of the magnetic recording pattern is transferred to the resist layer 42. In this instance, the resist layer 42 of a thickness t is left on the bottom surface of the recessed portion 61.

The resist layer 42 left on the bottom surface of the recessed portion 61 preferably has a thickness t equal to or more than 0 and equal to or less than 10 nm.

The mask layer 32 can be etched in the etching process of the mask layer 32, which will be described below, by setting the thickness t in the range, without formation of taper on sidewall of patterns in the mask layer 32. In addition, it is possible to enhance the shield property of the mask layer 32 with respect to the implanted ion by the ion milling. Consequently, since the magnetic recording pattern of the high precision is formed on the magnetic layer 30, the magnetic recording pattern forming characteristic is thereby enhanced.

In the process of transferring the pattern to the resist layer 42 by using the stamp 52, the stamp 52 is pressed on the resist layer 42 in the state in which the flowability of the resist layer 42 is high, and is simultaneously irradiated by the radiation to cure the resist layer 42 in the pressing state. Afterwards, the stamp 52 is preferably detached from the resist layer 42. Consequently, it is possible to transfer the shape of the surface of the stamp 52 having recessed and raised areas to the resist layer 42 with high precision.

The method for irradiating the radiation on the resist layer 42 in the state in which the stamp 52 is pressed includes a method for irradiating the radiation from the non-magnetic substrate 10 side, a method for irradiating the radiation from the stamp 52 side by selecting a constituent material of the stamp 52, which the radiation can penetrate through, a method for irradiating the radiation from a side of the stamp 52, and a method for irradiating the radiation from the stamp 52 or the non-magnetic substrate 10 through heat conduction by using radiation, such as heat waves, having high conductivity with respect to a solid.

In particular, as a material of the resist layer 42, a novolac-based resin or a UV-curable resin such as acrylate ester resin or alicyclic epoxy resin is preferably used. Further, as a material of the stamp 52, a glass or resin having high permeability with respect to ultraviolet rays is preferably used.

Next, as shown in FIG. 3(*b*), the resist layer 42 left on the bottom surface of the recessed portion 61 and the mask layer 32 left just below the recessed portion 61 are removed by using a common method such as dry etching, reactive ion etching or ion milling, so that the recessed portion 61 has a depth penetrating the resist layer 42 and the mask layer 32.

Moreover, as shown in FIG. 3(*c*), the magnetic layer 30 just below the recessed portion 61 is removed by the ion milling 72, so that the recessed portion 61 has a depth penetrating the resist layer 42, the mask layer 32, and the magnetic layer 30. Consequently, the recessed area 65 is formed on the magnetic layer 30.

In this instance, the magnetic layer 30 can be removed by a common method such as dry etching or reactive ion etching.

<Process of Forming the Corrosion-resistant Film>

Figure 4:
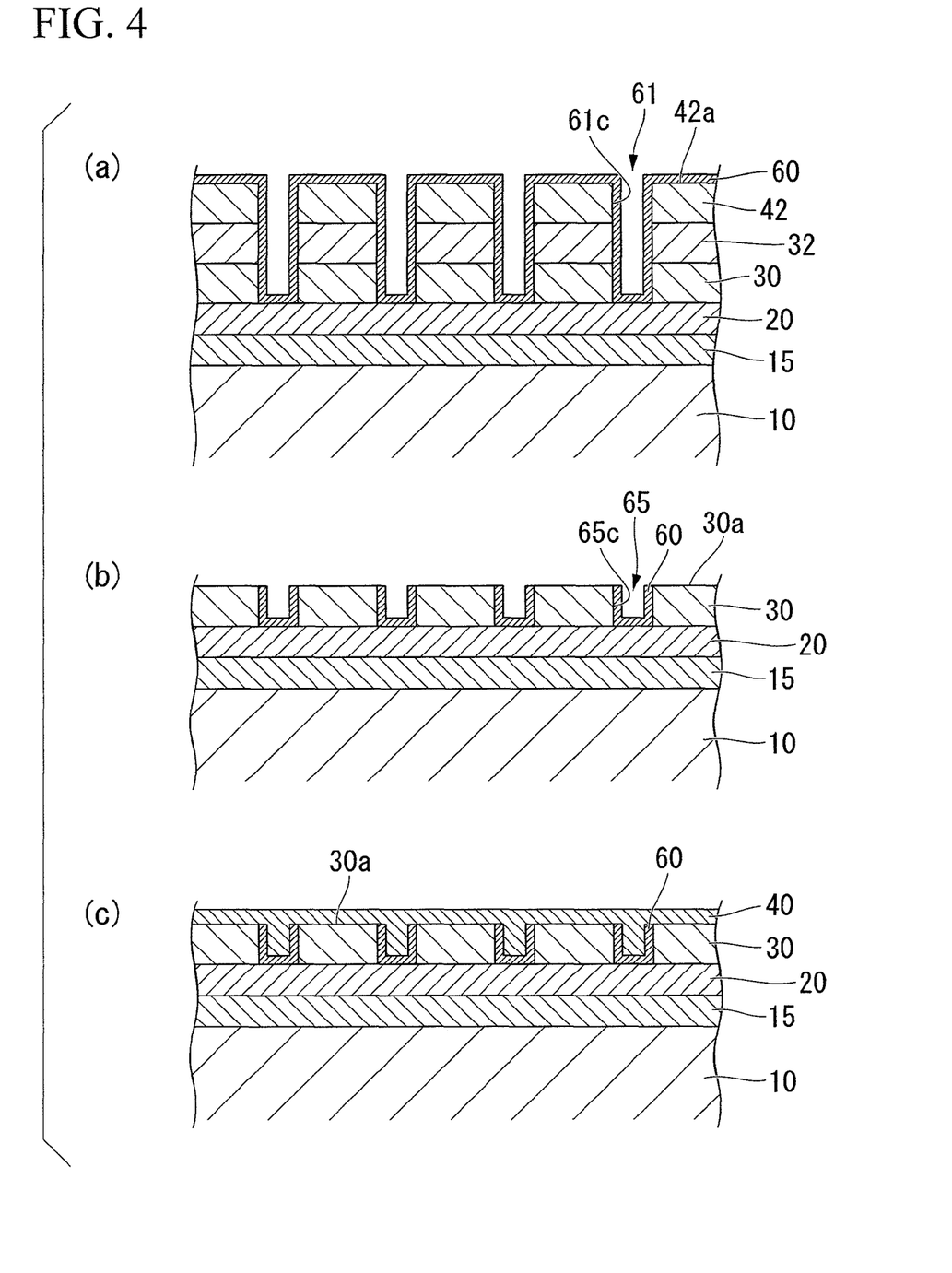
FIG. 4 is a process cross-sectional view showing an example of a method for manufacturing a magnetic recording medium according to the invention.

Next, as shown in FIG. 4(*a*), the corrosion-resistant film 60 is formed to cover the exposure surface 61*c* of the recessed portion 61 and the upper surface 42*a* of the resist layer 42. In this instance, the exposure surface 61*c* of the recessed portion 61 is constituted by a sidewall surface of the resist layer 42 in the recessed portion 61, a sidewall surface of the mask layer 32, a sidewall surface of the magnetic layer 30 and the exposed upper surface of the intermediate layer 20.

In terms of the adhesion with respect to the magnetic layer 30 and the convenience of film formation, the corrosion-resistant film 60 is preferably formed by a sputtering method.

The sputtering method preferably uses He gas or Ne gas. Consequently, it can form a corrosion-resistant film having high corrosion resistance as compared with the case of using Ar gas.

Next, as shown in FIG. 4(*b*), the resist layer 42 and the mask layer 32 are removed by using inductively coupled plasma (ICP) or a reactive ion etching (RIE) method using reactive plasma such as reactive ion plasma. The upper surface 30*a* of the magnetic layer 30 is exposed in the state in which the corrosion-resistant film 60 formed to cover the exposure surface 65*c* of the recessed area 65 is left.

The inductively coupled plasma is high-temperature plasma which is generated by applying high voltage to gas and is obtained by generating joule heat by the eddy current, which is created by a variable magnetic field of high frequency, in the plasma.

Further, the reactive ion plasma is plasma having high reaction in which the plasma is added by reactive gas such as $O_2$, $SF_6$, $CHF_3$, $CF_4$, $CCl_4$ or the like.

Since these reactive plasma are active species having a low directive property (straight advancing property), the active species do not come in contact with the inside of the recessed area 65 so as not to etch the inside of the recessed area 65, but the active species come in contact with only the upper surface to remove the resist layer 42 and the mask layer 32, in the state in which the corrosion-resistant film 60 is retained on the exposure surface 65*c* of the recessed area 65.

As a result, while the corrosion-resistant film 60 is retained on the exposure surface 65*c* of the recessed area 65, only the resist layer 42 and the mask layer 32 are selectively removed by etching.

In this instance, in the case in which the protective layer 50 is installed on the upper surface of the magnetic layer 30, it is preferable that a portion of the protective layer 52 be also removed when the resist layer 42 and the mask layer 32 are removed.

In this instance, the ion milling method using ions having a high straight advancing property, such as milling ion, cannot selectively etch only the resist layer 42 and the mask layer 32, and remove the corrosion-resistant film 60 installed on the exposure surface 65*c* of the recessed area 65 also. Therefore, it is not preferable as the method for removing the resist layer 4 and the mask layer 3.

In this embodiment, as shown in FIG. 4(*a*), the corrosion-resistant film 60 is formed to cover the upper surface 42*a* of the resist layer 42 and the recessed portion 61, and then the resist layer 42 and the mask layer 32 are removed (lifted off). Therefore, since the corrosion-resistant film 60 is left only on the exposure surface 65*c* of the recessed area 65, the corrosion-resistant film 60 does not remain on the upper surface 30a of the magnetic layer 30, so that writing or reading of a magnetic signal is not deteriorated at the time of magnetic recording or reproducing.

<Process of Forming the Magnetic Recording Pattern>

Next, the non-magnetic layer 40 made of an organosilicon compound is formed by using the spin on glass method, as shown in FIG. 4(c), to fill in the recessed area 65 and cover the upper surface 30a of the magnetic layer 30.

Since the non-magnetic layer 40 having excellent coverage is formed, the recessed area 65 is filled in without a clearance, thereby forming the non-magnetic layer 40 having a flat upper surface.

Figure 5:
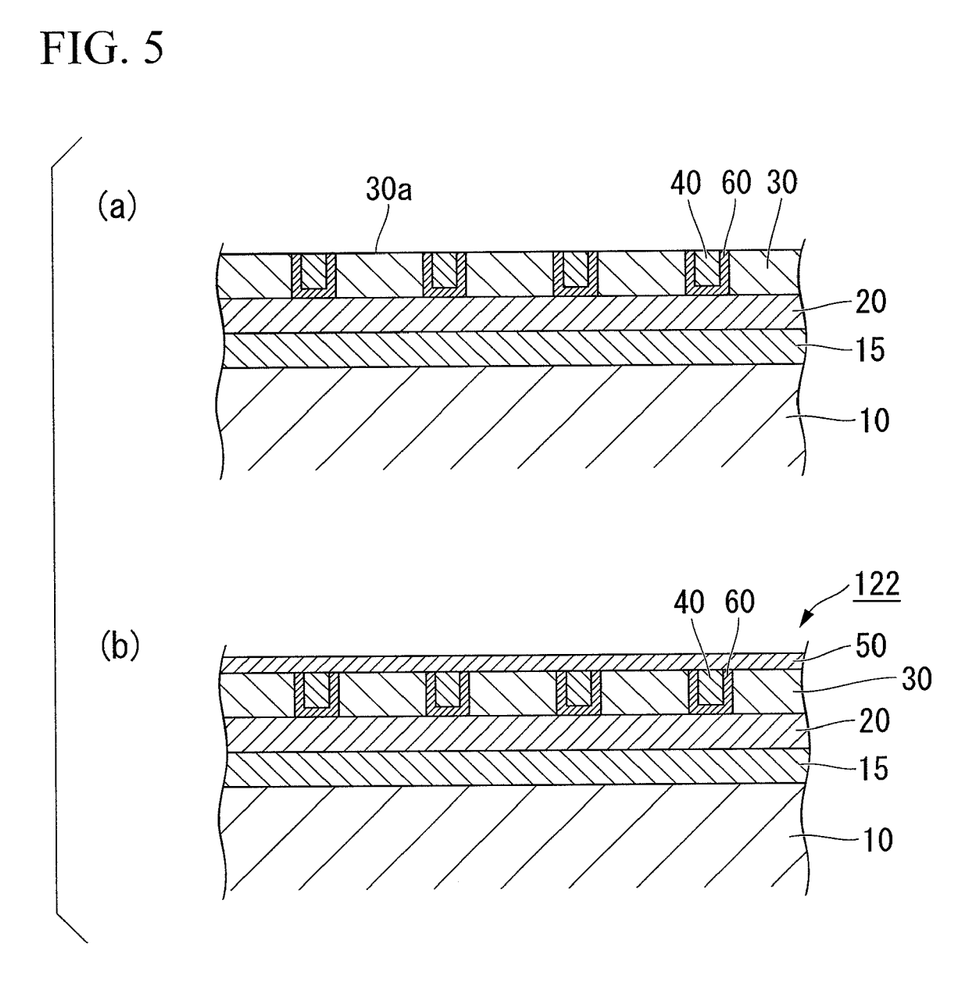
FIG. 5 is a process cross-sectional view showing an example of a method for manufacturing a magnetic recording medium according to the invention.

Next, as shown in FIG. 5(a), the non-magnetic layer 40 is removed by using a common method such as dry etching, reactive ion etching or ion milling until the upper surface 30a of the magnetic layer 30 is exposed. In this instance, since the upper surface of the non-magnetic layer 40 is a flat surface, the non-magnetic layer 40 can be removed at a uniform depth by etching, even by using an etching method having a high straight advancing property. Consequently, when seen from the upper surface side at a plane, the magnetic recording pattern made of the magnetic layer 30 which is magnetically separated by the non-magnetic layer 40 is formed.

Finally, as shown in FIG. 5(b), the protective layer 50 is formed on the magnetic layer 30 by a sputtering method or a CVD method to manufacture the magnetic recording medium 122 according to the embodiment of the invention.

It is necessary to set the film thickness of the protective layer 50 as 10 nm or less. In the case in which the protective layer 50 has a film thickness of less than 10 nm, a distance between the magnetic layer 30 and a magnetic head of the magnetic recording-reproducing apparatus which will be described below is extended, so that the magnetic head cannot obtain an output/input signal of sufficiently strong intensity from the magnetic layer 30.

The method for manufacturing the magnetic recording medium according to the embodiment of the invention includes the process of forming the magnetic layer 30 on the non-magnetic substrate 10, the process of forming the recessed area 65 in the magnetic layer 30, the process of forming the corrosion-resistant film 60 to cover the exposure surface 65c of the recessed area 65, and the process of forming the magnetic recording pattern made of the magnetically separated magnetic layer 30 by forming the non-magnetic layer 40 to fill in the recessed area 65 covered by the corrosion-resistant film 60. Therefore, it is possible that the corrosion-resistant film 60 prevent the machined portion of the magnetic layer 30 which is activated by the ion milling or the like, that is, the magnetic layer 30 of the exposure surface 65c of the recessed area 65, from reacting with the non-magnetic layer 40 and thus being corroded, so that the corrosion resistance can be remarkably enhanced in pattern media of a magnetic layer machining type, thereby providing the magnetic recording medium 122 having high environmental resistance. That is, a magnetic recording medium, such as discrete track media or bit pattern media, can be provided with high environmental resistance, and it does not easily cause the material containing Fe or Co to corrode.

According to the method for manufacturing the magnetic recording medium according to the embodiment of the invention, the corrosion-resistant film 60 is a metal film which is at least one selected from Cr, Ni, Al, Ti, Ta, Cu, Mo, Ru, Rh, Pd, W, Pt, and Au, so that the corrosion resistance can be remarkably enhanced in pattern media of a magnetic layer machining type, and the magnetic recording medium 122 having high environmental resistance can be provided.

According to the method for manufacturing the magnetic recording medium according to the embodiment of the invention, since the corrosion-resistant film 60 is the Cr film, the adhesion between the corrosion-resistant film 60 and the magnetic layer 30 is further enhanced, so that the corrosion resistance can be remarkably enhanced in pattern media of a magnetic layer machining type, and the magnetic recording medium 122 having high environmental resistance can be provided.

According to the method for manufacturing the magnetic recording medium according to the embodiment of the invention, since the corrosion-resistant film 60 is formed by the sputtering method using the He gas or the Ne gas, the corrosion resistance of the corrosion-resistant film 60 can be further enhanced, and the magnetic recording medium 122 having high environmental resistance can be provided.

According to the method for manufacturing the magnetic recording medium according to the embodiment of the invention, since the non-magnetic layer 40 is made of the organosilicon compound having low viscosity, low contraction when curing, and a good etching characteristic such as ion milling, the non-magnetic layer 40 having the flat surface can be formed by filling in the recessed area 65, and a smooth etched surface can be obtained. Consequently, the corrosion resistance can be remarkably enhanced in pattern media of a magnetic layer machining type, and the magnetic recording medium having the high environmental resistance can be provided.

According to the method for manufacturing the magnetic recording medium according to the embodiment of the invention, the process of forming the recessed area 65 in the magnetic layer 30 includes a process of forming and stacking the mask layer 32 and the resist layer 42 on the magnetic layer 30 in this order, a process of forming the recessed portion 61 in the resist layer 42 by the nanoimprint method, and a process of forming the recessed area 65 in the magnetic layer 30 by deepening the recessed portion 61 to the magnetic layer 30 through an etching method or an ion milling method. Consequently, the corrosion resistance can be remarkably enhanced in pattern media of a magnetic layer machining type, and the magnetic recording medium 122 having the high environmental resistance can be provided.

According to the method for manufacturing the magnetic recording medium according to the embodiment of the invention, the process of forming the corrosion-resistant film 60 to cover the exposure surface 65c of the recessed area 65 is a process of forming the resist layer 42 and the corrosion-resistant film 60 to cover the recessed portion 61, and removing the resist layer 42 and the mask layer 32 by using the inductively coupled plasma or the reactive ion plasma method to leave the corrosion-resistant film 60 formed to cover the exposure surface 65c of the recessed area 65. Consequently, the corrosion resistance can be remarkably enhanced in pattern media of a magnetic layer machining type, and the magnetic recording medium 122 having the high environmental resistance can be provided.

According to the magnetic recording medium 122 that is the embodiment of the invention and which includes the magnetic recording pattern made of the magnetically separated magnetic layer 30 on the non-magnetic substrate 10, the magnetic layer 30 is provided with the recessed area 65, the corrosion-resistant film 60 is formed to cover the exposure surface 65c of the recessed area 65, and the non-magnetic layer 40 is formed to fill in the recessed area 65 covered by the corrosion-resistant film 60. As a result, it is possible to prevent the machined portion of the magnetic layer 30 which is activated by the ion milling or the like, that is, the magnetic layer 30 of the exposure surface 65c of the recessed area 65, from reacting with the non-magnetic layer 40 and thus being corroded, thereby providing the magnetic recording medium 122 having high corrosion resistance.

<Magnetic Recording-Reproducing Apparatus>

Figure 6:
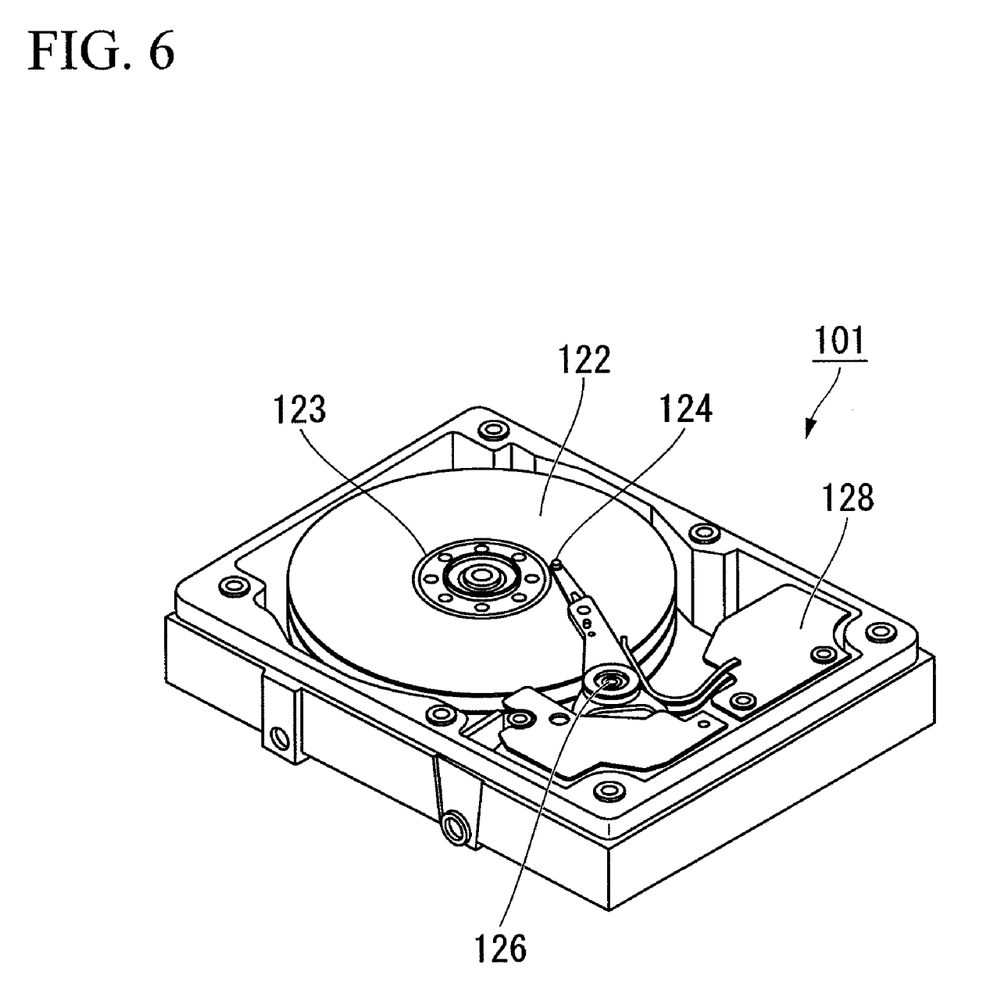
FIG. 6 is a perspective view showing an example of a magnetic recording-reproducing apparatus according to the invention.

FIG. 6 is a perspective view illustrating one example of the magnetic recording-reproducing apparatus according to the embodiment of the invention.

As shown in FIG. 6, a magnetic recording-reproducing apparatus 101 according to the embodiment of the invention includes a magnetic recording medium 122 according to an embodiment of the invention, a medium driving device 123 that drives the magnetic recording medium in a recording direction, a magnetic head 124 constituted by a recording device and a reproducing device, a magnetic head driving device 126 that relatively drives the magnetic head 124 with respect to the magnetic recording medium 122, and a recording-reproducing signal processing device 128 having a recording-reproducing signal processing means for inputting a signal to the magnetic head 124 and reproducing a signal output from the magnetic head 124.

The magnetic recording-reproducing apparatus 101 having high recording density can be constituted by combining these devices.

The discrete track type magnetic recording medium 122 illustrated in the invention can be operated by a recording track which is magnetically discontinuous, in a state in which the width of the reproducing head is equal to that of the recording head, as compared with the related art in which the width of a reproducing head is narrower than that of a recording head in order to eliminate the effect of a magnetization transition region of a track edge portion. Consequently, it can obtain a sufficient reproducing output and a high SNR.

In addition, since the reproducing device of the above-described magnetic head 124 is constituted by a GMR head or TMR head, sufficient signal intensity can be obtained in the high recording density, thereby implementing the magnetic recording apparatus having high recording density.

Further, if the magnetic head 124 flies at a height lower than the case of the related art, that is, the flying height of the magnetic head 124 is 0.005 μm to 0.020 μm, the output is enhanced to obtain the high device SNR, thereby providing the magnetic recording apparatus 101 with high capacity and high reliability.

Moreover, the recording density can be further enhanced by combining a signal processing circuit according to a maximum likelihood decoding method. For example, a sufficient SNR is obtained in the case of recording-reproducing at a track density of 100 k track/inch or more, a line recording density of 1000 k bit/inch or more, and a recording density of 100 G bits or more per square inch.

The magnetic recording-reproducing apparatus 101 according to the embodiment of the invention includes the magnetic recording medium 122, the medium driving device 123 that drives the magnetic recording medium 122 in a recording direction, the magnetic head 124 that performs recording and reproducing of information on or from the magnetic recording medium 122, the magnetic head driving device 126 that moves the magnetic head 123 over the magnetic recording medium 122, and the recording-reproducing signal processing device 128 that processes a recording-reproducing signal from the magnetic head. Consequently, the magnetic recording-reproducing apparatus 101 including the magnetic recording medium 122 having high environmental resistance can be provided.

EXAMPLES

Now, Examples of the invention will be described in detail. The invention is not limited to these Examples.

Example 1

After a glass substrate for a hard disk (HD) was set in a vacuum chamber, the inside of the vacuum chamber was evacuated by $1.0 \times 10^{-5}$ Pa or less.

In this instance, the glass substrate for the HD was a crystallized glass substrate made of $Li_2Si_2O_5$, $Al_2O_3$—$K_2O$, $MgO$—$P_2O_5$, or $Sb_2O_3$—$ZnO$ as a constituent component, and had an outer diameter of 65 mm, an inner diameter of 20 mm, and an average surface roughness (Ra) of 2 angstroms.

Next, on the glass substrate for the HD, a soft magnetic layer of FeCoB alloy, an intermediate layer of Ru, and a magnetic layer of 70Co-5Cr-15Pt-10SiO$_2$ alloy were stacked as a thin film in this order by using a DC sputtering method. In this instance, the FeCoB soft magnetic layer had a film thickness of 60 nm, the Ru intermediate layer had a film thickness of 10 nm, and the magnetic layer had a film thickness of 15 nm.

Next, a mask layer made of Ta was formed on the magnetic layer to have a film thickness of 60 nm by using a sputtering method.

In addition, a resist layer was formed on the mask layer to have a film thickness of 100 nm by using a spin coat method. A novolac-based resin which is a UV-curable resin was used as the resist layer.

Next, a glass stamp having a negative pattern corresponding to a magnetic recording pattern was pressed on the resist layer by pressure of 1 MPa (approximately 8.8 kgf/cm$^2$). In the pressing state, ultraviolet rays of 250 nm wavelength were irradiated on the glass stamp having UV transmittance of 95% or more from its upper portion for 10 seconds to cure the resist layer. After that, the glass stamp was detached from the resist layer, and the magnetic recording pattern was transferred to the resist layer.

In the magnetic recording pattern transferred to the resist layer, a raised area of the resist layer was a circular shape having a width of 120 nm, a recessed portion of the resist layer was a circular shape having a width of 60 nm, the film thickness of the resist layer is 80 nm, and the resist layer left on a bottom surface of the recessed portion had a thickness of approximately 5 nm.

Further, an angle of a sidewall surface in the recessed portion with respect to the surface of the substrate was approximately 90 degrees.

Next, the resist layer left on the bottom surface of the recessed portion and the mask layer (Ta layer) just below the recessed portion were removed by using a dry etching method, so that the recessed portion had a depth penetrating the resist layer and the mask layer.

Dry etching conditions with respect to the etching of the resist layer were O$_2$ gas of 40 sccm, pressure of 0.3 Pa, high-frequency plasma power of 300 W, DC bias of 30 W, and etching time of 10 seconds. Further, dry etching conditions with respect to the etching of the mask layer were CF$_4$ gas of 50 sccm, pressure of 0.6 Pa, high-frequency plasma power of 500 W, DC bias of 60 W, and etching time of 30 seconds.

Further, the magnetic layer just below the recessed portion was removed by 4 nm from the surface side of the resist layer through a dry etching method, so that the magnetic layer had an etch depth of 4 nm. The depth of the recessed portion was a depth penetrating the resist layer, the mask layer and the magnetic layer. In this instance, the magnetic layer was partially removed to form the recessed area in the bottom surface side of the recessed portion.

Dry etching conditions of the magnetic layer were Ar gas of 50 sccm, pressure of 0.6 Pa, high-frequency plasma power of 500 W, DC bias of 60 W, and etching time of 20 seconds.

Next, a corrosion-resistant film (Cr film) having a thickness of 3 nm was formed by a sputtering method using Ar gas to cover the exposure surface of the recessed area and the upper surface of the resist layer. Sputtering pressure was 0.6 Pa.

Next, the resist layer and the mask layer were removed by using an RIE method to expose the upper surface of the magnetic layer. Consequently, extra corrosion-resistant film (Cr film) formed on the mask layer and the resist layer was removed, but the corrosion-resistant film covering the exposure surface of the recessed area remained.

In this instance, an inductively coupled plasma apparatus NE 550 (trade name; made by Ulvac) was used as the RIE apparatus. Further, as the gas and conditions used to generate plasma, $O_2$ gas of 90 cc/minute was used, input power for generating the plasma was 200 W, pressure in the apparatus was 0.5 Pa, and the magnetic layer was processed for 100 seconds.

After the RIE processing, the film thickness (a film thickness of the corrosion-resistant film) of Cr remaining on the sidewall surface of the recessed area was measured as approximately 2 nm.

Next, a non-magnetic layer was formed by using a spin coat method to fill in the recessed area and cover the upper surface of the magnetic layer.

A silisesquioxane skeleton-containing organosilicion compound was used as a material of the non-magnetic layer, and an average film thickness of the non-magnetic layer was 80 nm. In this instance, the silisesquioxane skeleton-containing organosilicion compound had viscosity of 1171 mPa·s.

As spin coat conditions, 0.5 ml of silisesquioxane skeleton-containing organosilicion compound was dropped on a substrate set in a spin coater, and the substrate was rotated at 500 rpm for 5 seconds, was rotated at 3000 rpm for 2 seconds, and was rotated at 5000 rpm for 20 seconds.

Next, the non-magnetic layer was removed from the upper surface side by using ion beam etching to expose the upper surface of the magnetic layer, and then the entire surface of the upper surface of the magnetic layer was removed to a depth of approximately 1 nm by etching, thereby forming a smooth flat surface. Consequently, when seen from the upper surface side at a plane, the magnetic recording pattern made of the magnetic layer spaced and arranged by the non-magnetic layer was formed.

In addition, a protective film made of a DLC film having a thickness of 4 nm was formed by a CVD method.

Finally, a lubricant was applied on the protective film to form a lubricative layer having total thickness of 2 nm, thereby manufacturing the magnetic recording medium according to Example.

Examples 2 to 16

These Examples were identical to Example 1, except that the film forming conditions of the corrosion-resistant film (the material of the corrosion-resistant film, the kind and pressure of the sputtering gas, and the film thickness of the corrosion-resistant film) and the etch depth of the magnetic layer were set as the materials and values shown in Table 1, and magnetic recording media according to Examples 2 to 16 were manufactured.

Comparative Examples 1 and 2

As shown in Table 1, the Comparative Examples were identical to Examples 1 and 2, except that the corrosion-resistant film made of a Cr film was not installed, and magnetic recording media according to Comparative Examples 1 and 2 were manufactured.

(Evaluation on Corrosion Resistance)

Evaluation on the corrosion resistance was performed with respect to the magnetic recording media according to Examples 1 to 16 and Comparative Examples 1 and 2.

In the evaluation on the corrosion resistance, the magnetic recording medium was sustained during 96 hours under atmospheric circumstances having temperature of 90° C. and humidity of 90%. After that, a nitric acid aqueous solution of 3% was dropped on the surface of the magnetic recording medium at 5 portions (100 micro liter/portion) and pure water was dropped on the surface of the magnetic recording medium at 5 portions (100 micro liter/portion). The magnetic recording medium was left like this for 1 hour, and then the solution and water were collected. Co amounts (extracted amounts of Co) contained in the solution and water were measured by ICP-MS. In this instance, one milliliter of 3% nitric acid containing 200 ppt of Y was used as a reference solution in the measurement of the ICP-MS. As a result, the measured results (extracted amounts of Co) were obtained as shown in Table 1.

In Table 1, the film forming conditions of the corrosion-resistant film for the magnetic recording media according to Examples 1 to 16 (the material of the corrosion-resistant film, the kind and pressure of the sputtering gas, and the film thickness of the corrosion-resistant film), the etch depth of the magnetic layer, the extracted amount of Co and the etch depth of the magnetic layer and the extracted amount of Co in Comparative Examples 1 and 2 were listed herein.

TABLE 1

|  | Corrosion-resistant film | Sputtering gas/pressure | Film thickness of corrosion-resistant film (nm) | Etch depth of magnetic layer (nm) | Extracted amount of Co (ng/disk) |
|---|---|---|---|---|---|
| Example 1 | Cr | Ar/0.6Pa | 2 | 4 | 0.25 |
| Example 2 | Cr | Ar/0.6Pa | 2 | 10 | 0.65 |
| Example 3 | Cr | Ar/0.6Pa | 4 | 4 | 0.06 |
| Example 4 | Cr | Ar/0.6Pa | 4 | 10 | 0.12 |
| Example 5 | Cr | Ar/0.6Pa | 6 | 10 | 0.11 |
| Example 6 | Ru | Ar/0.6Pa | 4 | 10 | 0.06 |
| Example 7 | Ti | Ar/0.6Pa | 4 | 10 | 0.11 |
| Example 8 | $Cr_{10}Ti$ | Ar/0.6Pa | 4 | 10 | 0.1 |
| Example 9 | Ta | Ar/0.6Pa | 4 | 10 | 0.14 |
| Example 10 | Mo | Ar/0.6Pa | 4 | 10 | 0.15 |

TABLE 1-continued

|  | Corrosion-resistant film | Sputtering gas/pressure | Film thickness of corrosion-resistant film (nm) | Etch depth of magnetic layer (nm) | Extracted amount of Co (ng/disk) |
|---|---|---|---|---|---|
| Example 11 | Pd | Ar/0.6Pa | 4 | 10 | 0.11 |
| Example 12 | Pt | Ar/0.6Pa | 4 | 10 | 0.07 |
| Example 13 | $Cr_{10}Ti$ | Ar/0.6Pa | 4 | 10 | 0.09 |
| Example 14 | Cr | Ne/1.0Pa | 2 | 10 | 0.09 |
| Example 15 | Cr | He/3.0Pa | 2 | 10 | 0.13 |
| Example 16 | Ru | Ne/1.0Pa | 2 | 10 | 0.08 |
| Comparative Example 1 | — | — | — | 4 | 12 |
| Comparative Example 2 | — | — | — | 10 | 76 |

According to the method for manufacturing the magnetic recording medium, the magnetic recording medium and the magnetic recording-reproducing apparatus according to the invention, the corrosion resistance can be remarkably enhanced in pattern media of a magnetic layer machining type, the magnetic recording medium having high environmental resistance can be provided, and it can be used in industries of manufacturing and employing the magnetic recording medium having high environment resistance.

DESCRIPTION OF REFERENCE NUMERALS IN FIGURES

W WIDTH OF MAGNETIC PORTION IN MAGNETIC RECORDING PATTERN
L WIDTH OF NON-MAGNETIC PORTION IN MAGNETIC RECORDING PATTERN
P TRACK PITCH
10 NON-MAGNETIC SUBSTRATE
15 SOFT MAGNETIC LAYER
20 INTERMEDIATE LAYER
30 MAGNETIC LAYER
30a UPPER SURFACE
32 MASK LAYER
40 NON-MAGNETIC LAYER
42 RESIST LAYER
42a UPPER SURFACE
50 PROTECTIVE LAYER
52 STAMP
60 CORROSION-RESISTANT FILM
61 RECESSED PORTION
61c EXPOSURE SURFACE
65 RECESSED AREA
65c EXPOSURE SURFACE
72 MILLING ION
101 MAGNETIC RECORDING-REPRODUCING APPARATUS
122 MAGNETIC RECORDING MEDIUM
123 MEDIUM DRIVING DEVICE
124 MAGNETIC HEAD
126 MAGNETIC HEAD DRIVING DEVICE
128 RECORDING-REPRODUCING SIGNAL PROCESSING DEVICE.

What is claimed is:

1. A method for manufacturing a magnetic recording medium, comprising the steps of:
    forming a magnetic layer on a non-magnetic substrate;
    forming a recessed area in the magnetic layer;
    forming a corrosion-resistant film to cover an exposure surface of the recessed area; and
    forming a non-magnetic layer to fill in the recessed area covered by the corrosion-resistant film to form a magnetic recording pattern made of a magnetically separated magnetic layer.

2. The method for manufacturing a magnetic recording medium according to claim 1, wherein the corrosion-resistant film is a metal film which is at least one selected from the group consisting of Cr, Ni, Al, Ti, Ta, Cu, Mo, Ru, Rh, Pd, W, Pt, and Au.

3. The method for manufacturing a magnetic recording medium according to claim 1, wherein the corrosion-resistant film is a Cr film.

4. The method for manufacturing a magnetic recording medium according to claim 1, wherein the corrosion-resistant film is formed by a sputtering method using He gas or Ne gas.

5. The method for manufacturing a magnetic recording medium according to claim 1, wherein the non-magnetic layer is made of an organosilicon compound.

6. The method for manufacturing a magnetic recording medium according to claim 1, wherein the step of forming the recessed area in the magnetic layer comprises the processes of:
    forming and stacking a mask layer and a resist layer on the magnetic layer in this order;
    forming a recessed portion in the resist layer by a nanoimprint method; and
    forming a recessed area in the magnetic layer by deepening the recessed portion to the magnetic layer through an etching method or an ion milling method.

7. The method for manufacturing a magnetic recording medium according to claim 6, wherein the step of forming the corrosion-resistant film to cover the exposure surface of the recessed area is a step of
    forming the corrosion-resistant film to cover the recessed portion and the resist layer, and then removing the resist layer and the mask layer by using an inductively coupled plasma or a reactive ion plasma method to leave the corrosion-resistant film formed to cover the exposure surface of the recessed area.

* * * * *